US012615045B2

(12) United States Patent
Hirai

(10) Patent No.: US 12,615,045 B2
(45) Date of Patent: Apr. 28, 2026

(54) SEMICONDUCTOR INTEGRATED CIRCUIT AND ELECTRONIC DEVICE

(71) Applicant: Masaru Hirai, Tokyo (JP)

(72) Inventor: Masaru Hirai, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 30 days.

(21) Appl. No.: 18/939,978

(22) Filed: Nov. 7, 2024

(65) Prior Publication Data

US 2025/0158608 A1    May 15, 2025

(30) Foreign Application Priority Data

Nov. 10, 2023    (JP) ................................. 2023-192374

(51) Int. Cl.
*H03K 17/22* (2006.01)
*B60R 16/033* (2006.01)
*G06F 1/24* (2006.01)

(52) U.S. Cl.
CPC ......... *H03K 17/223* (2013.01); *B60R 16/033* (2013.01); *G06F 1/24* (2013.01)

(58) Field of Classification Search
CPC .. H03K 17/22; H03K 17/223; H03K 3/02335; H03K 3/0375; H03K 3/356008; H03K 5/04; H03K 5/08; H03K 5/082; H03K 5/22; H03K 5/24; H03K 5/2472; G06F 1/24; B60R 16/033
See application file for complete search history.

(56) References Cited

U.S. PATENT DOCUMENTS

| 12,388,437 B2 * | 8/2025 | Takano ................ H03K 17/223 |
| 2022/0271747 A1 | 8/2022 | Takano et al. |

FOREIGN PATENT DOCUMENTS

| JP | 2022-129021 | 9/2022 |

* cited by examiner

*Primary Examiner* — Long Nguyen
(74) *Attorney, Agent, or Firm* — IPUSA, PLLC

(57) ABSTRACT

A semiconductor integrated circuit includes a first detection circuit and a second detection circuit. The first detection circuit is configured to assert a first signal until a first input voltage decreases from a first detection voltage to a first operating voltage limit, and to cause the first signal to enter an indeterminate state, upon occurrence of a condition in which the first input voltage decreases to be less than the first operating voltage limit. The second detection circuit is configured to assert a second signal until a second input voltage decreases from a second detection voltage to a second operating voltage limit, and to cause the second signal to enter an indeterminate state, upon occurrence of a condition in which the second input voltage decreases to be less than the second operating voltage limit.

7 Claims, 8 Drawing Sheets

FIG.6

SEMICONDUCTOR INTEGRATED CIRCUIT AND ELECTRONIC DEVICE

CROSS-REFERENCE TO RELATED APPLICATIONS

This application claims priority under 35 U.S.C. § 119 to Japanese Patent Application No. 2023-192374, filed Nov. 10, 2023, the contents of which are incorporated herein by reference.

BACKGROUND

1. Technical Field

The present disclosure relates to a semiconductor integrated circuit and an electronic device.

2. Description of the Related Art

There is a known reset semiconductor integrated circuit equipped with a voltage detection circuit that outputs a reset signal when a power supply voltage of a monitored object is less than a predetermined level (see Patent Document 1).

RELATED-ART DOCUMENT

[Patent Document]
  Patent Document 1: Japanese Unexamined Patent Application Publication No. 2022-129021

SUMMARY

A first aspect of the present disclosure relates to a semiconductor integrated circuit including:
  a plurality of terminals including a first input terminal, a second input terminal, and an output terminal;
  a first detection circuit configured to
    operate by a first input voltage, as a first power supply voltage, at the first input terminal,
    detect a drop in the first input voltage to assert a first signal;
  a second detection circuit configured to
    operate by a second input voltage, as a second power supply voltage, at the second input terminal,
    detect a drop in the second input voltage to assert a second signal; and
  an output circuit configured to
    monitor the first signal and the second signal, and
    output a reset signal from the output terminal, upon occurrence of a condition in which the first signal or the second signal is asserted.
The first detection circuit is configured to
  assert the first signal until the first input voltage decreases from a first detection voltage to a first operating voltage limit, and
  cause the first signal to enter an indeterminate state, upon occurrence of a condition in which the first input voltage decreases to be less than the first operating voltage limit.
The second detection circuit is configured to
  assert the second signal until the second input voltage decreases from a second detection voltage to a second operating voltage limit, and
  cause the second signal to enter an indeterminate state, upon occurrence of a condition in which the second input voltage decreases to be less than the second operating voltage limit, and
  the first operating voltage limit is less than the second operating voltage limit.
A second aspect of the present disclosure relates to the semiconductor integrated circuit of the first aspect. The first detection circuit may include:
  a first transistor having a first threshold voltage, and the first transistor is configured to turn off upon occurrence of a condition in which the first input voltage decreases to be less than the first operating voltage limit, in conjunction with a condition in which a gate voltage of the first transistor becomes less than the first threshold voltage,
  the second detection circuit includes a second transistor having a second threshold voltage, and the second transistor is configured to turn off upon occurrence of a condition in which the second input voltage decreases to be less than the second operating voltage limit, in conjunction with a condition in which a gate voltage of the second transistor becomes less than the second threshold voltage, and
  the first threshold voltage is less than the second threshold voltage.
A third aspect of the present disclosure relates to the semiconductor integrated circuit of the second aspect. The first transistor may have a withstand voltage less than that of the second transistor.
A fourth aspect of the present disclosure relates to the semiconductor integrated circuit of any one of the first aspect to the third aspect. The output circuit may include:
  a logic circuit to which the first signal and the second signal are configured to be input, and
  an output stage configured to output the reset signal in accordance with an output signal of the logic circuit.
A fifth aspect of the present disclosure relates to an electronic device including:
  the semiconductor integrated circuit of any one of the first aspect to the fourth aspect;
  a first power line coupled to the first input terminal;
  a second power line coupled to the second input terminal; and
  an electronic circuit coupled to the first power line and the output terminal.
A sixth aspect of the present disclosure relates to the electronic device of the fifth aspect that may further includes:
  a regulator configured to decrease a voltage of the second power line to output the decreased voltage to the first power line.
A seventh aspect of the present disclosure relates to the electronic device of the sixth aspect. The second power line may be configured to be coupled to a battery power line for a vehicle.

BRIEF DESCRIPTION OF THE DRAWINGS

FIG. 6 is a diagram showing a configuration example of a first detection circuit.

DETAILED DESCRIPTION

The inventor of this application has recognized the following information in related art. When a power supply voltage of a semiconductor integrated circuit drops to less than an operating voltage limit, a reset signal output that is from the semiconductor integrated circuit may become indeterminate. In this case, a reset of an electronic circuit may malfunction before the power supply voltage of the electronic circuit that receives a reset signal drops to less than an operating voltage limit of the electronic circuit. For example, if a timing at which the reset of the electronic circuit malfunctions is too early compared to a timing at which the power supply voltage of the electronic circuit drops to less than the operating voltage limit of the electronic circuit, an operating voltage range for the electronic circuit may be excessively limited.

An object of the present disclosure is to provide a semiconductor integrated circuit capable of reducing an operating voltage limit that allows for outputting of a reset signal, and to provide an electronic device with the semiconductor integrated circuit.

Hereinafter, embodiments of the present disclosure will be described with reference to the drawings.

Figure 1:
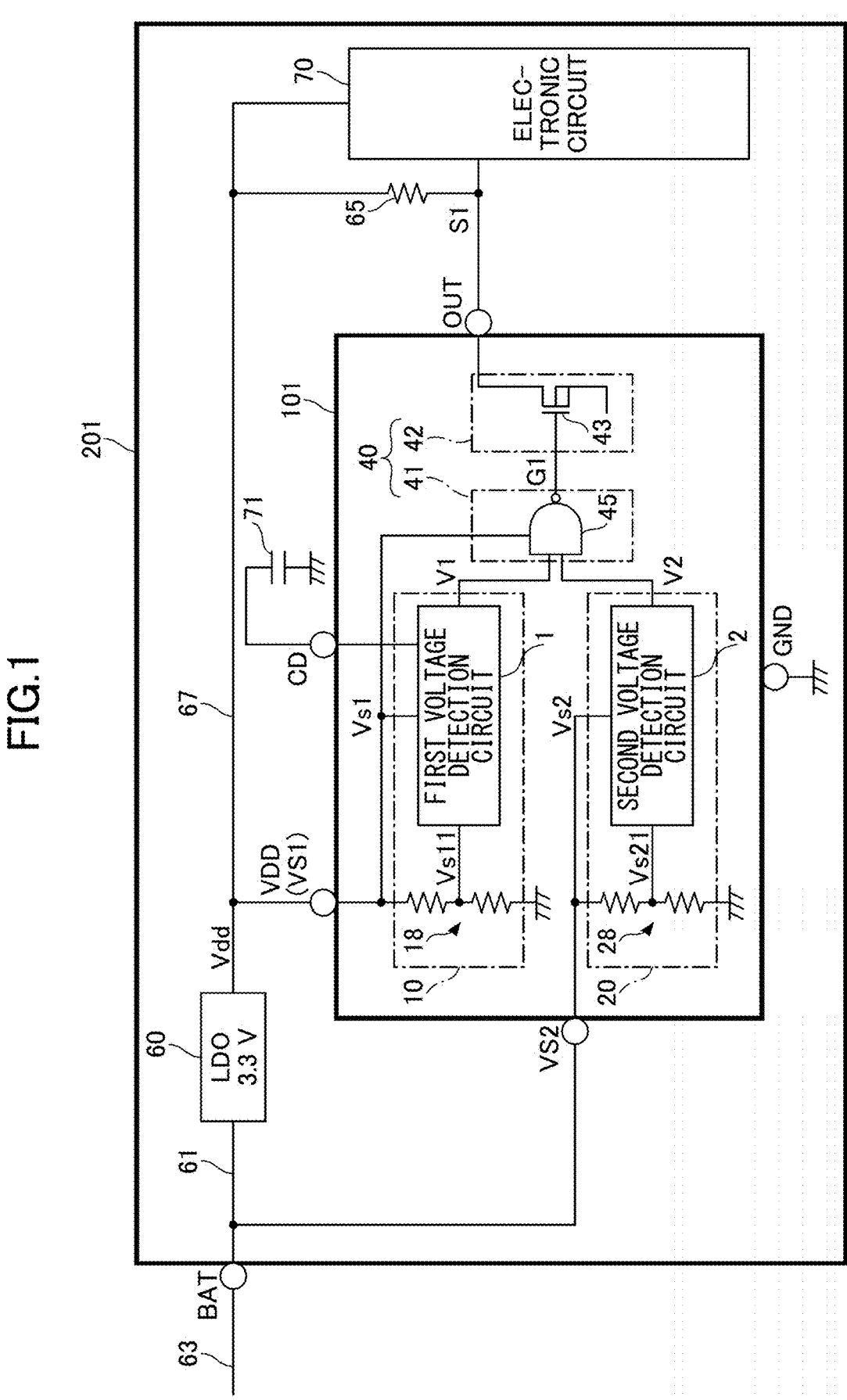
FIG. 1 is a diagram showing a configuration example of an electronic device including a semiconductor integrated circuit according to a first embodiment.

FIG. 1 is a diagram showing a configuration example of an electronic device including a semiconductor integrated circuit according to a first embodiment. An electronic device 201 shown in FIG. 1 includes a reset integrated circuit (IC) 101. The reset IC 101 is an example of a semiconductor integrated circuit according to the first embodiment. The reset IC may be referred to as a voltage detector.

The electronic device 201 is a device for a vehicle, and is mounted and used in the vehicle. Specific examples of the electronic device 201 include a car navigation device, a drive recorder, an in-vehicle device for an electronic toll collection system (ETC), a universal serial bus (USB) connector, a camera, a radar, a communication device, and an electronic control unit (ECU), and the like. However, the electronic device 201 is not limited to the above examples.

The electronic device 201 is a device including an on-vehicle power supply (not shown) to be connected to a battery power line 63 that is mounted on a vehicle as an operating power supply. The electronic device 201 operates by direct current (DC) power that is supplied from the on-vehicle power supply (not shown) via the battery power line 63. The on-vehicle power supply is, for example, a 12-volt battery. The battery power line 63 is, for example, a wire harness for a battery power supply.

The electronic device 201 includes a terminal BAT, a regulator 60, a first power line 67, a second power line 61, an electronic circuit 70, and the reset IC 101.

The terminal BAT is a battery power terminal connected to the battery power line 63 of the vehicle. The battery power line 63 is connected to the second power line 61 of the electronic device 201 via the terminal BAT. The DC power supplied from the battery power line 63 is input to the second power line 61 of the electronic device 201 via the terminal BAT. The DC power input from the terminal BAT is input to both an input terminal of the regulator 60 and a second input terminal VS2 of the reset IC 101 via the second power line 61. The second power line 61 is, for example, a power supply pattern that is built into the electronic device 201 and is formed on a substrate on which the reset IC 101 is mounted.

The regulator 60 is a power supply circuit that steps down the DC voltage of the second power line 61 to a constant power supply voltage Vdd and outputs the power supply voltage Vdd to the first power line 67. The regulator 60 steps down the DC voltage of, for example, 12 volts to generate the power supply voltage Vdd of 3.3 volts. A specific example of the regulator 60 includes a linear regulator such as a low drop out (LDO) regulator. The power supply voltage Vdd generated by the regulator 60 is supplied to the power supply terminal VDD of the reset IC 101 and the power supply terminal of the electronic circuit 70 via the first power line 67. The first power line 67 is implemented, for example, by a power supply pattern that is incorporated in the electronic device 201 and that is formed on the substrate on which the reset IC 101 is mounted.

The electronic circuit 70 operates by the power supply voltage Vdd, and activates by a reset signal S1 that is supplied from the reset IC 101. The electronic device 201 starts up by the activation of the electronic circuit 70. The electronic circuit 70 controls the operation of the electronic device 201. Specific examples of the electronic circuit 70 include a processor such as a central processing unit (CPU); a microcomputer; a system-on-chip (SoC); or a large-scale semiconductor integrated circuit (LSI).

The reset IC 101 has a function of monitoring the respective voltages of the first power line 67 and the second power line 61. The reset IC 101 monitors the voltages of the first power line 67 and the second power line 61, and outputs the reset signal S1 from the output terminal OUT to the electronic circuit 70, based on a monitoring result.

The reset IC 101 includes a first input terminal VS1 (power supply terminal VDD), a ground terminal GND, a second input terminal VS2, an output terminal OUT, a first voltage detection circuit (which may be hereinafter referred to as a first detection circuit) 10, a second detection circuit (which may be hereinafter referred to as a second detection circuit) 20, and an output circuit 40. The reset IC 101 may include a release delay terminal CD.

The first input terminal VS1 (power supply terminal VDD) is connected to the first power line 67, and the power supply voltage Vdd of the first power line 67 is input to the first input terminal VS1 (power supply terminal VDD). The ground terminal GND is connected to a reference potential such as a ground potential. The reset IC 101 operates with reference to the potential of the ground terminal GND, and operates by the power supply voltage Vdd that is applied between the power supply terminal VDD and the ground terminal GND.

The second input terminal VS2 is connected to the second power line 61, and the power supply voltage of the second power line 61 is input to the second input terminal VS2. The output terminal OUT is connected to a reset terminal of the electronic circuit 70, and outputs the reset signal S1 that is generated by the reset IC 101. The release delay terminal CD is connected to a capacitor 71 for producing a delay time for the reset signal S1.

The first detection circuit 10 is a voltage detection circuit connected to the first input terminal VS1, and operates with a first input voltage Vs1, which is a voltage of the first input terminal VS1, as a power supply voltage (operating voltage). The first input voltage Vs1 corresponds to the power supply voltage Vdd applied between the power supply terminal VDD and the ground terminal GND.

The first detection circuit 10 detects a voltage drop (specifically, insufficient first input voltage Vs1) at the first input terminal VS1. When the first detection circuit 10 detects the voltage drop at the first input terminal VS1 (a drop in the first input voltage Vs1), the first detection circuit 10 asserts a first signal V1. For example, when the first detection circuit 10 detects a state in which the first input voltage Vs1 drops to less than a predetermined first detection voltage VTHD1, the first detection circuit 10 asserts the first signal V1. On the other hand, when the first detection circuit 10 detects a state in which the first input voltage Vs1 exceeds a predetermined first release voltage VTHU1, the first detection circuit 10 negates the first signal V1.

Hysteresis exists between the first release voltage VTHU1 and the first detection voltage VTHD1. The first release voltage VTHU1 is a threshold that is set to a voltage value higher than the first detection voltage VTHD1.

The second detection circuit 20 is a voltage detection circuit connected to the second input terminal VS2, and operates with a second input voltage Vs2, which is a voltage of the second input terminal VS2, as a power supply voltage (operating voltage). The second input voltage Vs2 corresponds to a power supply voltage that is applied between the second input terminal VS2 and the ground terminal GND.

The second detection circuit 20 detects a voltage drop (specifically, insufficient second input voltage Vs2) at the second input terminal VS2. When the second detection circuit 20 detects a voltage drop at the second input terminal VS2 (a drop in the second input voltage Vs2), the second detection circuit 20 asserts a second signal V2. For example, when the second detection circuit 20 detects a state in which the second input voltage Vs2 is less than a predetermined second detection voltage VTHD2, the second detection circuit 20 asserts the second signal V2. On the other hand, when the second detection circuit 20 detects a state in which the second input voltage Vs2 exceeds a predetermined second release voltage VTHU2, it negates the second signal V2.

Hysteresis exists between the second release voltage VTHU2 and the second detection voltage VTHD2. The second release voltage VTHU2 is a threshold that is set to a voltage value higher than the second detection voltage VTHD2.

The output circuit 40 monitors the first signal V1 and the second signal V2, and outputs the reset signal S1 from the output terminal OUT when the first signal V1 or the second signal V2 is asserted. More specifically, the output circuit 40 outputs the reset signal S1 from the output terminal OUT either when the first detection circuit 10 detects that the first input voltage Vs1 is less than the first detection voltage VTHD1 or when the second detection circuit 20 detects that the second input voltage Vs2 is less than the second detection voltage VTHD2.

The output circuit 40 monitors the first signal V1 and the second signal V2, and stops outputting the reset signal S1 from the output terminal OUT when the first signal V1 and the second signal V2 are negated. More specifically, the output circuit 40 releases the output of the reset signal S1 from the output terminal OUT both when the first detection circuit 10 detects that the first input voltage Vs1 is higher than the first release voltage VTHU1 and when the second detection circuit 20 detects that the second input voltage Vs2 is higher than the second release voltage VTHU2.

The output circuit 40 includes, for example, a logic circuit 41 to which the first signal V1 and the second signal V2 are input, and includes an output stage 42 that outputs the reset signal S1 in accordance with an output signal G1 of the logic circuit 41. The logic circuit 41 operates with the first input voltage Vs1, as a power supply voltage (operating voltage), corresponding to the power supply voltage Vdd applied between the power supply terminal VDD and the ground terminal GND.

The logic circuit 41 includes, for example, a NAND gate 45 to which the first signal V1 and the second signal V2 are input. The logic circuit 41 monitors the first signal V1 and the second signal V2 by using the NAND gate 45. When either the first signal V1 or the second signal V2 is asserted, the logic circuit 41 outputs, to the output stage 42, the output signal G1 to cause a low-level reset signal S1 to be output from the output terminal OUT. On the other hand, the logic circuit 41 monitors the first signal V1 and the second signal V2 by using the NAND gate 45, and when both the first signal V1 and the second signal V2 are negated, the logic circuit 41 stops outputting the output signal G1 to the output stage 42, and stops outputting the reset signal S1 from the output terminal OUT. In this arrangement, the output of the reset signal S1 from the output terminal OUT is released, and thus a high-level signal is output from the output terminal OUT.

The output stage 42 includes, for example, a transistor 43 that outputs the reset signal S1 in open-drain format. The transistor 43 is, for example, a metal oxide semiconductor field-effect transistor (MOSFET) having a gate to which the output signal G1 is input, a source connected to the ground terminal GND, and a drain connected to the output terminal OUT. The output terminal OUT is pulled up to the first power line 67 via an external resistor 65. The resistor 65 is externally connected to the reset IC 101, the magnitude of the high-level output voltage (a high-level voltage value of the reset signal S1) at the output terminal OUT can be arbitrarily set by the potential of the first power line 67.

In this arrangement, the reset IC 101 monitors the voltage of the first power line 67 connected to the first input terminal VS1 by monitoring the first input voltage Vs1, and also, the reset IC 101 monitors the voltage of the second power line 61 connected to the second input terminal VS2 by monitoring the second input voltage Vs2. When the reset IC detects either a state in which the first input voltage Vs1 is less than the predetermined first detection voltage VTHD1 or a state in which the second input voltage Vs2 is less than the predetermined second detection voltage VTHD2, the reset IC 101 outputs, as the reset signal S1, a signal having a level (e.g., a low level) indicating a voltage abnormal drop state, from the output terminal OUT.

On the other hand, when the reset IC detects both a state in which the first input voltage Vs1 is higher than the first release voltage VTHU1 and a state in which the second input voltage Vs2 is higher than the second release voltage VTHU2, the reset IC 101 outputs a signal having a level (for example, a high level) indicating a normal voltage state, from the output terminal OUT (releases the output of the reset signal S1).

As described above, the reset IC 101 in the first embodiment has a voltage drop detection function for a plurality of channels (in this example, the first power line 67 and the second power line 61). The voltage drop detection function for the plurality of channels is implemented by the reset IC 101 that is a single chip, and thus a component mounting area can be reduced as compared with a case where the voltage drop detection function for the plurality of channels is implemented by a plurality of chips.

The first detection circuit 10 asserts the first signal V1 until the first input voltage Vs1 drops from the first detection voltage VTHD1 to a first operating voltage limit VL1, and when the first input voltage Vs1 drops to less than the first operating voltage limit VL1, the first detection circuit 10 makes the first signal V1 indeterminate. The first operating voltage limit VL1 is a minimum operating voltage that allows the first detection circuit 10 to maintain the assertion of the first signal V1. On the other hand, the second detection circuit 20 asserts the second signal V2 until the second input voltage Vs2 drops from the second detection voltage VTHD2 to a second operating voltage limit VL2, and when the second input voltage Vs2 drops to less than the second operating voltage limit VL2, the second detection circuit 20 makes the second signal V2 indeterminate. The second operating voltage limit VL2 is a minimum operating voltage that allows the second detection circuit 20 to maintain the assertion of the second signal V2.

In the reset IC 101 in the first embodiment, the first detection circuit 10 and the second detection circuit 20 are configured such that the first operating voltage limit VL1 is set to be less than the second operating voltage limit VL2. In this case, when the second input voltage Vs2 drops to less than the second operating voltage limit VL2, the second signal V2 enters an indeterminate state. On the other hand, even if the first input voltage Vs1 drops to the same voltage as the second operating voltage limit VL2 at which the second signal V2 enters the indeterminate state, the first signal V1 does not enter an indeterminate state and is maintained in an asserted state. By maintaining the assertion of the first signal V1, the output circuit 40 can maintain the output of the reset signal S1. In this arrangement, an operating voltage limit that allows for the output of the reset signal S1 can be reduced to the first operating voltage limit VL1.

Because the operating voltage limit that allows for the output of the reset signal S1 can be reduced to the first operating voltage limit VL1, the possibility of reset malfunction in the electronic circuit 70 before the power supply voltage of the electronic circuit 70 drops to less than the operating voltage limit for the electronic circuit 70 can be reduced. In this case, for example, a timing of the reset malfunction in the electronic circuit 70 can be easily adjusted so as not to be too early as compared with a timing at which the power supply voltage of the electronic circuit 70 drops to less than an operating voltage limit for the electronic circuit 70. Therefore, the possibility that an operating voltage range for the electronic circuit 70 is excessively limited can be reduced. In addition, a voltage range in which the assertion of the reset signal S1 is capable of being maintained can expand to lower levels, and as a result, the reset IC 101 can be suitably employed as a reset IC for the electronic circuit 70 having a relatively low operating voltage limit.

Hereinafter, the semiconductor integrated circuit in a comparative example will be described in order to explain the functions and effects of the semiconductor integrated circuit according to the first embodiment in more detail.

Figure 2:
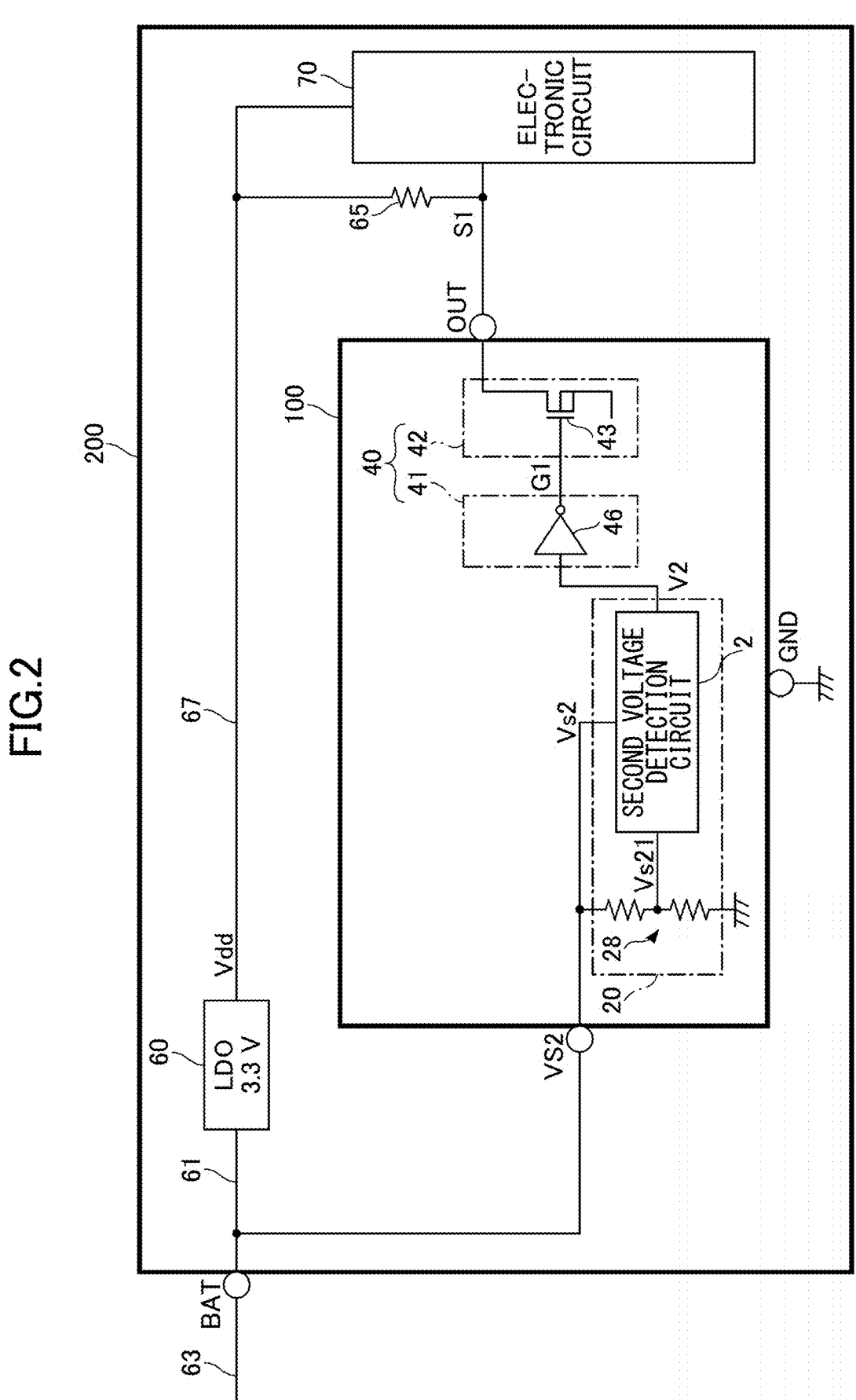
FIG. 2 is a diagram showing a configuration example of the electronic device including the semiconductor integrated circuit in a comparative example.

FIG. 2 is a diagram showing a configuration example of the electronic device including the semiconductor integrated circuit in the comparative example. An electronic device 202 shown in FIG. 2 includes a reset IC 100. The reset IC 100 monitors the voltage of the second power line 61 and outputs a reset signal S1 from the output terminal OUT to the electronic circuit 70 based on a monitoring result. The reset IC 100 shown in FIG. 2 differs from the reset IC 101 shown in FIG. 1 in that the reset IC 100 does not include a first detection circuit 10.

The second detection circuit 20 shown in FIG. 2 has the same configuration and function as described in the second detection circuit 20 shown in FIG. 1. The second detection circuit 20 is a voltage detection circuit connected to the second input terminal VS2, and operates with the second input voltage Vs2, which is a voltage of the second input terminal VS2, as a power supply voltage (operating voltage). The second detection circuit 20 asserts the second signal V2 until the second input voltage Vs2 drops from the second detection voltage VTHD2 to the second operating voltage limit VL2, and when the second input voltage Vs2 drops to less than the second operating voltage limit VL2, the second signal V2 enters an indeterminate state.

The output circuit 40 shown in FIG. 2 monitors the second signal V2, and outputs the reset signal S1 from the output terminal OUT when the second signal V2 is asserted. The output circuit 40 includes a logic circuit 41 to which the second signal V2 is input, and includes an output stage 42 that outputs the reset signal S1 in accordance with the output signal G1 of the logic circuit 41. The logic circuit 41 operates with the second input voltage Vs2 corresponding to the power supply voltage that is applied between the second input terminal VS2 and the ground terminal GND, where the second input voltage Vs2 is used as a power supply voltage (operating voltage)

The logic circuit 41 includes, for example, a NOT gate 46 to which the second signal V2 is input. The logic circuit 41 monitors the second signal V2 by using the NOT gate 46, and when the second signal V2 is asserted, the logic circuit 41 outputs, to the output stage 42, an output signal G1 that allows a low-level reset signal S1 to be output from the output terminal OUT. On the other hand, the logic circuit 41 monitors the second signal V2 by using the NOT gate 46, and when the second signal V2 is negated, the logic circuit 41 stops outputting the output signal G1 to the output stage 42, and stops outputting the reset signal S1 from the output terminal OUT. As a result, the output of the reset signal S1 from the output terminal OUT is released, and thus a high-level signal is output from the output terminal OUT.

In the comparative example shown in FIG. 2, the second detection circuit 20 makes the second signal V2 indeterminate when the second input voltage Vs2 drops to less than the second operating voltage limit VL2. In this case, an operating voltage limit at which the reset signal S1 is capable of being output can be only reduced to the second operating voltage limit VL2. In contrast, in the first embodiment as shown in FIG. 1, as described above, an operating voltage limit at which the reset signal S1 is capable of being output can be reduced to the first operating voltage limit VL1 that is less than the second operating voltage limit VL2.

Figure 3:
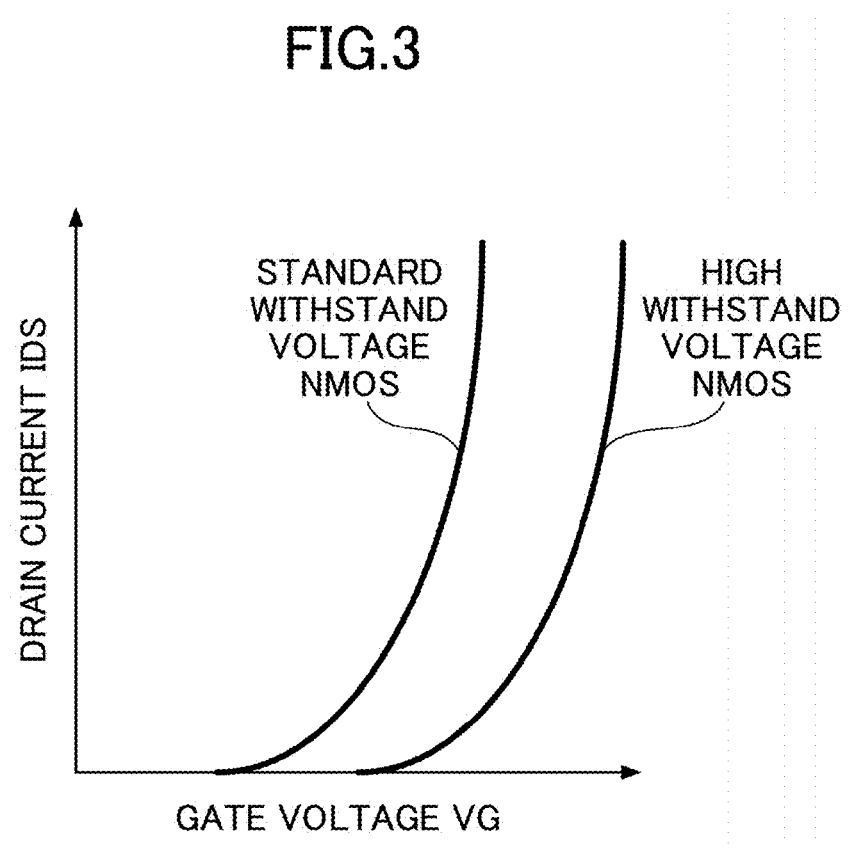
FIG. 3 is a diagram showing an example of the relationship between a gate voltage VG and a drain current IDS.

In some cases, an overvoltage occurs on the battery power line 63 and the second power line 61 due to a misconnection or the like of a 24-volt battery for a truck. For this reason, in the comparative example shown in FIG. 2, the second detection circuit 20 and the logic circuit 41, to each of which the high voltage of the second power line 61 may be applied, and the transistor 43 driven by the logic circuit 41 are all formed to have a relatively high withstand voltage. For example, as shown in FIG. 3, a transistor is formed by using a high withstand voltage NMOS transistor whose threshold voltage is higher than that of a standard withstand voltage NMOS transistor. The NMOS transistor refers to an N-channel MOSFET.

Figure 4:
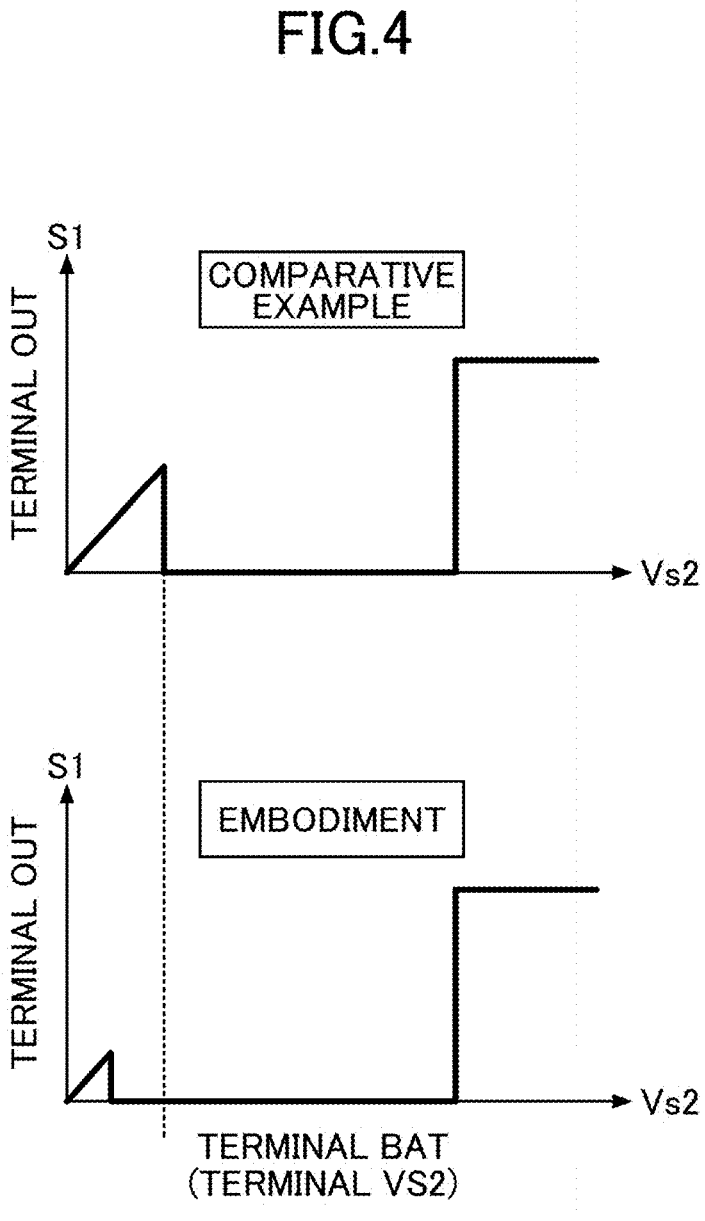
FIG. 4 is a diagram for describing respective operating voltage limits in the comparative example and the embodiment.

A threshold voltage of the high withstand voltage NMOS transistor is higher than that of the standard withstand voltage NMOS transistor. In this case, if a gate voltage decreases in accordance with a decreasing voltage of the second power line 61 (the second input voltage Vs2), the high withstand voltage NMOS transistor fails to maintain an on-state at a relatively high gate voltage value. As a result, as shown in the upper part of FIG. 4, when the second input voltage Vs2 is a relatively high voltage value, the reset signal S1 enters an indeterminate state.

In contrast, in the first embodiment shown in FIG. 1, the second detection circuit 20 to which the high voltage of the second power line 61 can be applied is formed to have a relatively high withstand voltage. On the other hand, the first detection circuit 10 and the logic circuit 41, to each of which the low voltage of the first power line 67 is applied, and the transistor 43 driven by the logic circuit 41 are all formed to have a relatively low withstand voltage. For example, the above circuits and transistor are formed by using a standard withstand voltage NMOS transistor whose threshold voltage is less than that of the high withstand voltage NMOS transistor as shown in FIG. 3.

A threshold voltage of the standard withstand voltage NMOS transistor is less than that of the high withstand voltage NMOS transistor. In this arrangement, even if the first input voltage Vs1 decreases as the voltage (the second input voltage Vs2) of the second power line 61 drops, and a gate voltage decreases as the first input voltage Vs1 drops, the standard withstand voltage NMOS transistor can maintain an on-state down to a relatively low gate voltage value. As a result, as shown in the lower part of FIG. 4, the operating voltage limit at which the reset signal S1 is capable of being output can be reduced as compared with the upper part of FIG. 4.

As described above, in the first embodiment shown in FIG. 1, the first detection circuit 10 includes, for example, a first transistor T1 having a first threshold voltage Vth1. The first transistor T1 is, for example, the standard withstand voltage NMOS transistor described above. The first transistor T1 is an element that turns off when the first input voltage Vs1 drops to less than the first operating voltage limit VL1, because the gate voltage becomes less than the first threshold voltage Vth1. On the other hand, the second detection circuit 20 includes, for example, a second transistor T2 having a second threshold voltage Vth2. The second transistor T2 is, for example, the above-mentioned high withstand voltage NMOS transistor. The second transistor T2 is an element that turns off when the gate voltage becomes less than the second threshold voltage Vth2 under a condition in which the second input voltage Vs2 drops to less than the second operating voltage limit VL2.

In the reset IC 101 of the first embodiment, the first detection circuit 10 and the second detection circuit 20 are formed such that the first threshold voltage Vth1 is set to be less than the second threshold voltage Vth2. For example, the first transistor T1 has a withstand voltage less than that of the second transistor T2, and thus the first threshold voltage Vth1 is set to be less than the second threshold voltage Vth2. When the first threshold voltage Vth1 is less than the second threshold voltage Vth2, even if the gate voltage of the first transistor T1 drops to the same voltage as the second threshold voltage Vth2 at which the second transistor T2 is turned off, the first transistor T1 does not turn off and maintains the on-state. By maintaining the on-state of the first transistor T1, the assertion of the first signal V1 and the level of the output signal G1 are maintained, and the output circuit 40 can maintain the output of the reset signal S1. In this arrangement, the operating voltage limit that allows for the output of the reset signal S1 can be reduced to the first operating voltage limit VL1.

Figure 5:
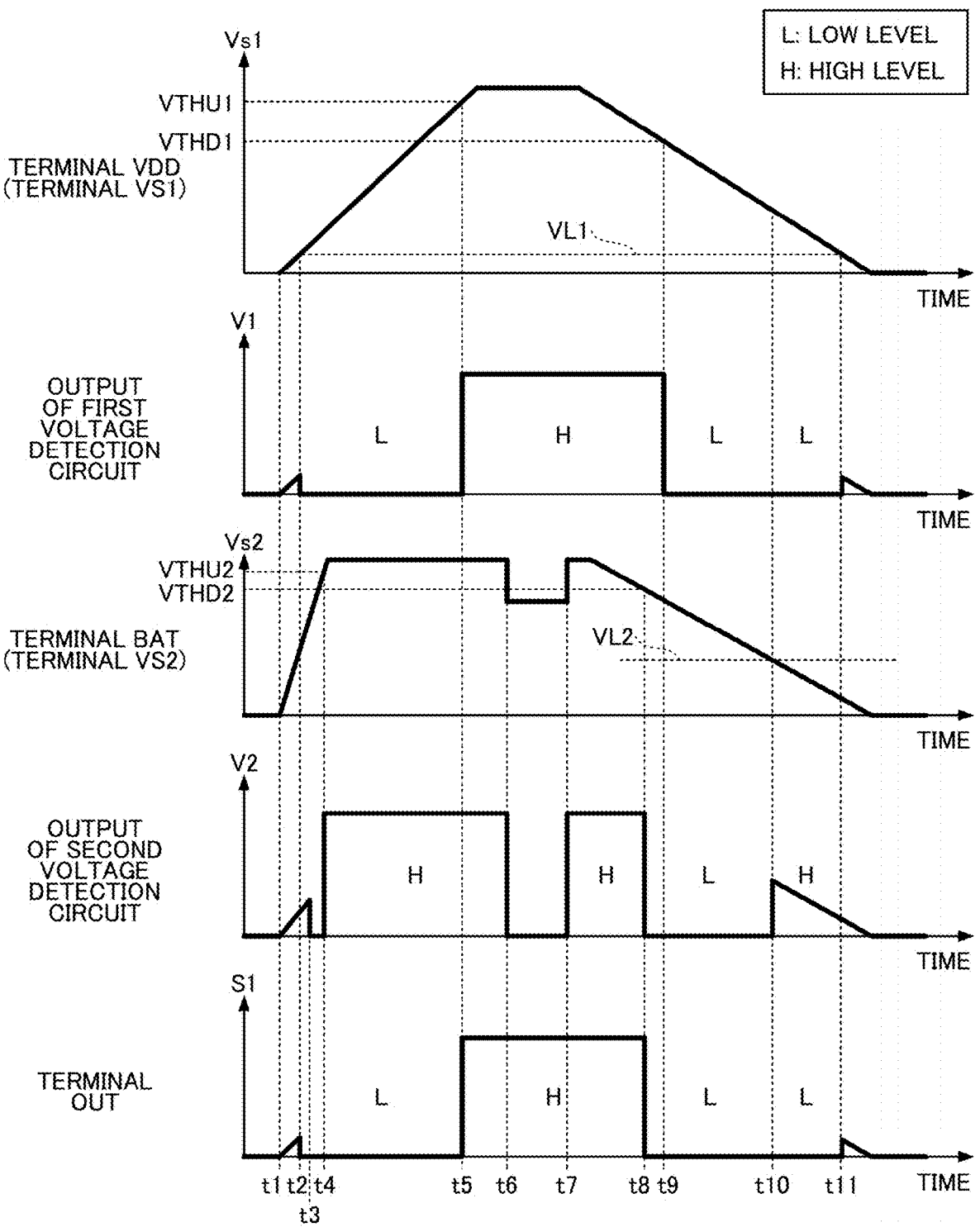
FIG. 5 is a timing chart showing an example of the operation of the semiconductor integrated circuit according to the first embodiment.

FIG. 5 is a timing chart showing an operation example of the semiconductor integrated circuit according to the first embodiment. When the first input voltage Vs1 is less than the first operating voltage limit VL1, the first signal V1 output from the first detection circuit 10 is in an indeterminate state (from time t1 to time t2). The first detection circuit 10 asserts the first signal V1 until the first input voltage Vs1 rises from the first operating voltage limit VL1 to the first release voltage VTHU1 (from time t2 to time t5). When the first input voltage Vs1 rises and becomes higher than the first release voltage VTHU1, the first detection circuit 10 switches the first signal V1 from an asserted state to a negated state (after time t5). In this example, the first signal V1 changes from a low level to a high level.

When the first input voltage Vs1 drops to become less than the first detection voltage VTHD1, the first detection circuit 10 switches the first signal V1 from the negated state to the asserted state (after time t9). In this example, the first signal V1 changes from a high level to a low level. The first detection circuit 10 asserts the first signal V1 until the first input voltage Vs1 drops from the first detection voltage VTHD1 to the first operating voltage limit VL1 (from time t9 to time t11). When the first input voltage Vs1 is less than the first operating voltage limit VL1, the first signal V1 output from the first detection circuit 10 enters an indeterminate state (after time t11).

On the other hand, when the second input voltage Vs2 is less than the second operating voltage limit VL2, the second signal V2 output from the second detection circuit 20 is in an indeterminate state (from time t1 to time t3). The second detection circuit 20 asserts the second signal V2 until the second input voltage Vs2 rises from the second operating voltage limit VL2 to the second release voltage VTHU2 (from time t3 to time t4). When the second input voltage Vs2 rises to become higher than the second release voltage VTHU2, the second detection circuit 20 switches the second signal V2 from an asserted state to a negated state (after time t4). In this example, the second signal V2 changes from a low level to a high level.

When the second input voltage Vs2 drops to become less than the second detection voltage VTHD2, the second detection circuit 20 switches the second signal V2 from the negated state to the asserted state (from time t6 to time t8). In this example, the second signal V2 changes from the high level to the low level. The second detection circuit 20 asserts the second signal V2 until the second input voltage Vs2 drops from the second detection voltage VTHD2 to the second operating voltage limit VL2 (from time t8 to time t10). When the second input voltage Vs2 is less than the second operating voltage limit VL2, the second signal V2 output from the second detection circuit 20 enters an indeterminate state (after time t10).

In this arrangement, when either the first signal V1 or the second signal V2 is asserted, the reset IC 101 outputs a low-level reset signal S1 from the output terminal OUT. On the other hand, when both the first signal V1 and the second signal V2 are negated, the reset IC 101 outputs a high-level reset signal S1 from the output terminal OUT. During a period from the time t6 to the time t7, the second signal V2 is asserted, but the output of the high-level reset signal S1 is maintained because the output terminal OUT is pulled up to the first power line 67 by the resistor 65. When the first input voltage Vs1 is less than the first operating voltage limit VL1, which is less than the second operating voltage limit VL2, the reset IC 101 makes the reset signal S1 indeterminate. With this approach, the operating voltage limit that allows for the output of the reset signal S1 can be reduced to the first operating voltage limit VL1.

Figure 6:
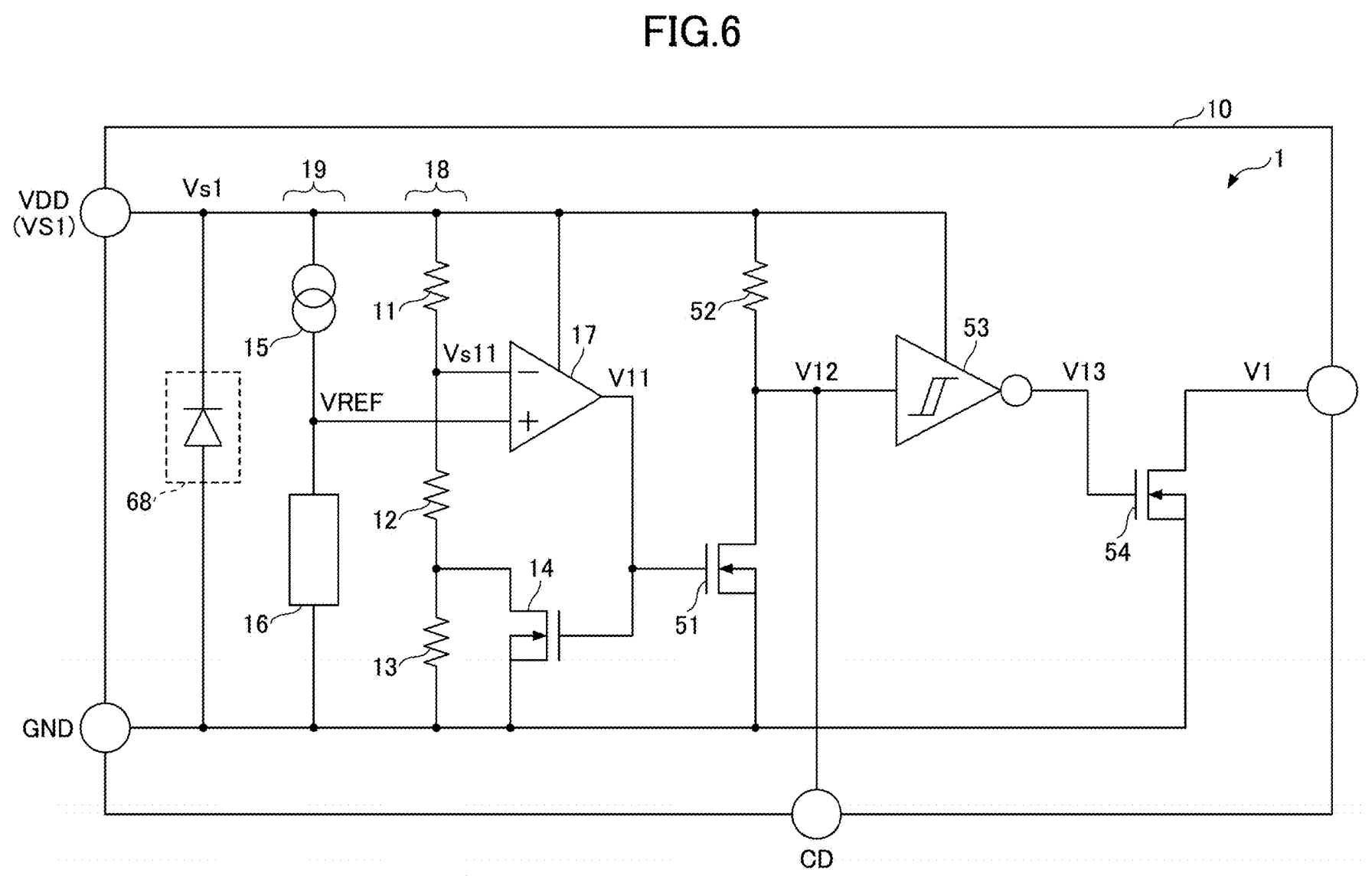

FIG. 6 is a diagram showing a configuration example of the first detection circuit. The first detection circuit 10 monitors the first input voltage Vs1. When a drop in the first input voltage Vs1 is detected, the first detection circuit 10 asserts the first signal V1. In this case, the first detection circuit 10 outputs the low-level first signal V1. On the other hand, when the drop in the first input voltage Vs1 is not detected, the first detection circuit 10 negates the first signal V1. In this case, the first detection circuit 10 outputs the high-level first signal V1.

The first detection circuit 10 includes a resistive voltage divider circuit 18 (which includes resistors 11, 12, and 13) and a first voltage detection circuit 1. The first voltage detection circuit 1 includes a diode 68, a comparator 17, a transistor 14, a reference voltage generation circuit 19 (which includes a constant current source 15 and a reference voltage source 16), a transistor 51, a resistor 52, a Schmitt trigger 53, and a transistor 54.

The diode 68 has an anode connected to the ground terminal GND, and has a cathode connected to the first input terminal VS1. The diode 68 clamps a negative first input voltage Vs1 through a forward voltage of the diode 68, and thus the first detection circuit 10 is protected from the negative first input voltage Vs1. The diode 68 is, for example, an electrostatic protection element.

The resistive voltage divider circuit 18 is a monitoring circuit for monitoring the first input voltage Vs1. The resistive voltage divider circuit 18 is a series circuit of the resistor 11, the resistor 12, and the resistor 13, and is connected between the ground terminal GND and the first input terminal VS1. The resistive voltage divider circuit 18 outputs a detection voltage Vs11 that is obtained by dividing the first input voltage Vs1 at a junction of the resistor 11 and the resistor 12. That is, the detection voltage Vs11 is a value corresponding to the first input voltage Vs1.

The resistive voltage divider circuit 18 outputs the detection voltage Vs11 that is obtained by dividing the first input voltage Vs1 through the resistor 11 and the resistors 12 and 13 because the transistor 14 is off when the output voltage V11 of the comparator 17 is at a low level. The resistive voltage divider circuit 18 outputs the detection voltage Vs11 that is obtained by dividing the first input voltage Vs1 through the resistor 11 and the resistor 12, because the transistor 14 is on when the output voltage V11 of the comparator 17 is at a high level. In this arrangement, hysteresis (=first release voltage VTHU1−first detection voltage VTHD1) can be added to the comparison of the detection voltage Vs11 generated by the resistive voltage divider circuit 18, with a reference voltage VREF generated by the reference voltage generation circuit 19.

The comparator 17 compares the detection voltage Vs11 with the reference voltage VREF, and outputs an output voltage V11 corresponding to a comparison result. The reference voltage VREF is a constant voltage value that is generated by step-down conversion of the power supply voltage Vdd through the reference voltage generation circuit 19. The reference voltage VREF is input to a non-inverting input terminal of the comparator 17, and the detection voltage Vs11 is input to an inverting input terminal of the comparator 17. The comparator 17 outputs a high-level output voltage V11 when the detection voltage Vs11 is less than the reference voltage VREF, and when the detection voltage Vs11 is higher than the reference voltage VREF, the comparator 17 outputs a low-level output voltage V11.

The reference voltage generation circuit 19 generates the constant reference voltage VREF that is less than the power supply voltage Vdd, for example, by passing a constant current that flows from the constant current source 15 into the reference voltage source 16. The constant current source 15 is composed of, for example, a depletion MOSFET in which a drain is connected to the power supply voltage Vdd and a short circuit is formed between a gate and a source. The reference voltage source 16 is composed of, for example, a diode-connected depletion MOSFET.

In this arrangement, when the output voltage V11 is at a high level, the first voltage detection circuit 1 turns on the transistor 51, detecting the drop in the first input voltage Vs1. When the transistor 51 is turned on, a logic signal V12 switches to a low level. The Schmitt trigger 53 causes the logic signal V13 to switch to a high level. The transistor 54 is turned on in response to a high-level logic signal V13, and thus a low-level first signal V1 is output (the first signal V1 is asserted).

On the other hand, when the output voltage V11 is at the low level, the first voltage detection circuit 1 turns off the transistor 51, detecting a normal voltage state of the first input voltage Vs1. When the transistor 51 turns off, the logic signal V12 switches to a high level. The Schmitt trigger 53 causes the logic signal V13 to switch to a low level. The transistor 54 turns off in response to the logic signal V13 at the low level, and thus pull-up resistor (not shown) outputs the high-level first signal V1 (the first signal V1 is negated).

For example, part or all of the constant current source 15, the reference voltage source 16, the comparator 17, the transistors 14, 51, and 54, and the Schmitt trigger 53 are each formed by using the first transistor T1.

Figure 7:
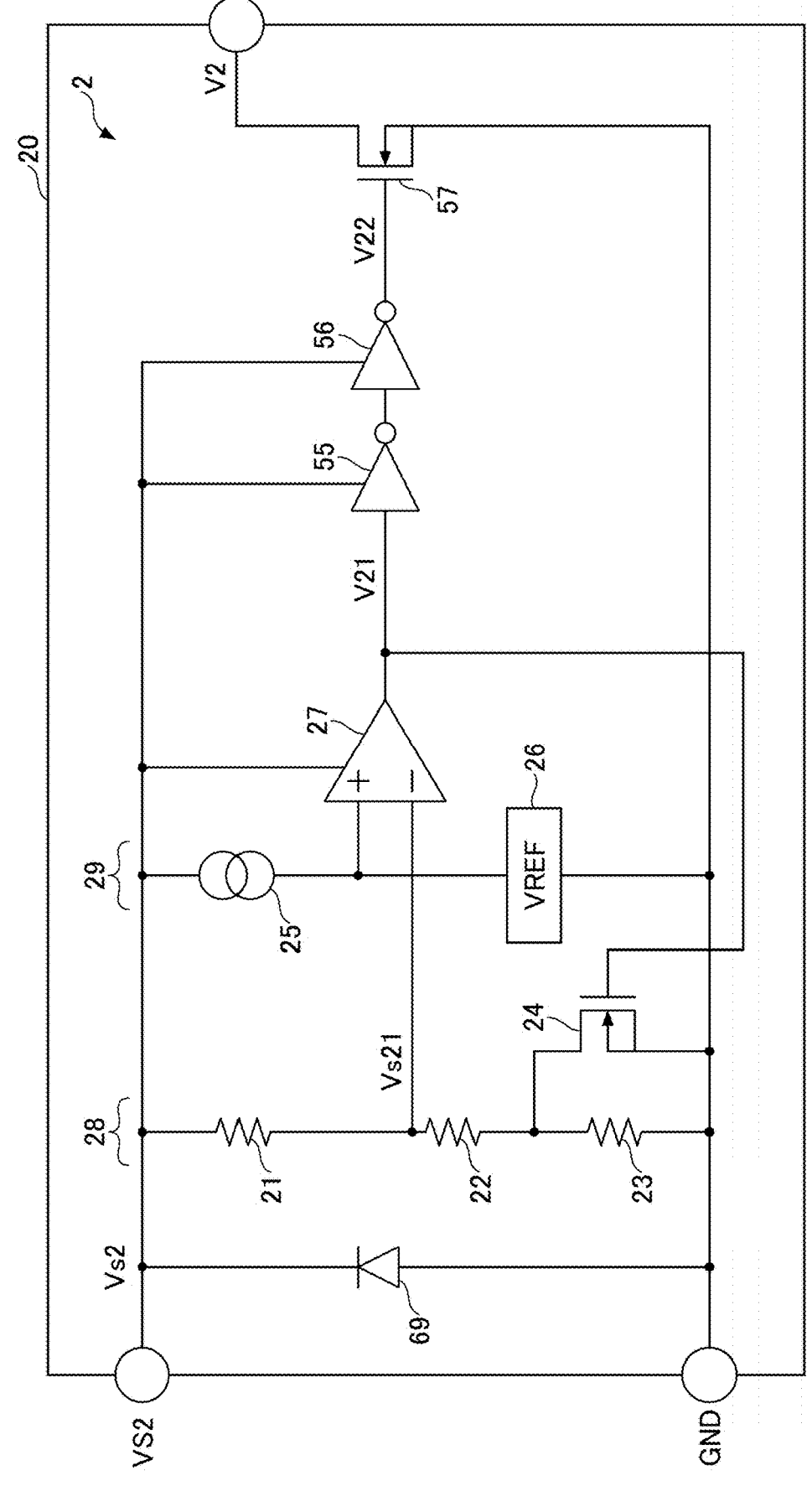
FIG. 7 is a diagram showing a configuration example of a second detection circuit.

FIG. 7 is a diagram showing a configuration example of the second detection circuit. The second detection circuit 20 monitors the second input voltage Vs2. When the drop in the second input voltage Vs2 is detected, the second detection circuit 20 asserts the second signal V2, and outputs a low-level second signal V2. On the other hand, when the drop in the second input voltage Vs2 is not detected, the second detection circuit 20 negates the second signal V2, and outputs a high-level second signal V2.

The second detection circuit 20 includes a resistive voltage divider circuit 28 (which includes resistors 21, 22, and 23) and a second voltage detection circuit 2. The second voltage detection circuit 2 includes a diode 69, a comparator 27, a transistor 24, a reference voltage generation circuit 29 (which includes a constant current source 25 and a reference voltage source 26), inverter circuits 55 and 56, and a transistor 57.

The diode 69 includes an anode connected to the ground terminal GND, and includes a cathode connected to the second input terminal VS2. The diode 69 clamps a negative second input voltage Vs2 through the forward voltage of the diode 69, and thus the second detection circuit 20 is protected from the negative second input voltage Vs2. The diode 69 is, for example, an electrostatic protection element.

The resistive voltage divider circuit 28 is a monitoring circuit for monitoring the second input voltage Vs2. The resistive voltage divider circuit 18 is a series circuit of the resistor 21, the resistor 22, and the resistor 23, and is connected between the ground terminal GND and the second input terminal VS2. The resistive voltage divider circuit 28 outputs a detection voltage Vs21 that is obtained by dividing the second input voltage Vs2 at a junction of the resistor 21 and the resistor 22. In other words, the detection voltage Vs21 is a value corresponding to the second input voltage Vs2.

When an output voltage V21 of the comparator 27 is at a low level, the transistor 24 is off, and the resistive voltage divider circuit 28 outputs the detection voltage Vs21 that is obtained by dividing the second input voltage Vs2 through the resistor 21 and the resistors 22 and 23. When the output voltage V21 of the comparator 27 is at a high level, the transistor 24 is on, and the resistive voltage divider circuit 28 outputs the detection voltage Vs21 that is obtained by dividing the second input voltage Vs2 through the resistor 21 and the resistor 22. In this arrangement, the above-described hysteresis (=second release voltage VTHU2–second detection voltage VTHD2) can be added to the comparison of the detection voltage Vs21 generated by the resistive voltage divider circuit 28, with the reference voltage VREF generated by the reference voltage generation circuit 29.

The comparator 27 compares the detection voltage Vs21 with the reference voltage VREF, and outputs the output voltage V21 that corresponds to a comparison result. The reference voltage VREF is a constant voltage value that is generated by step-down conversion of the power supply voltage Vdd through the reference voltage generation circuit 29. The reference voltage VREF is input to a non-inverting input terminal of the comparator 27, and the detection voltage Vs21 is input to an inverting input terminal of the comparator 27. The comparator 27 outputs a high-level output voltage V21 when the detection voltage Vs21 is less than the reference voltage VREF, and when the detection voltage Vs21 is higher than the reference voltage VREF, the comparator 27 outputs a low-level output voltage V21.

The reference voltage generation circuit 29 generates the constant reference voltage VREF less than the power supply voltage Vdd, for example, by passing a constant current that flows from the constant current source 25 into the reference voltage source 26. The constant current source 25 is composed of, for example, a depletion MOSFET in which a drain is connected to the power supply voltage Vdd and a short circuit is formed between a gate and a source. The reference voltage source 26 is composed of, for example, a diode-connected depletion MOSFET.

In this arrangement, when the output voltage V21 is at the high level, the second voltage detection circuit 2 sets the logic signal V22 to a high level through inverter circuits 55 and 56 each of which inverts a logical relationship between input and output signals, detecting the drop in the second input voltage Vs2. The transistor 57 turns on in response to the high-level logic signal V22, and thus the low-level second signal V2 is output (the second signal V2 is asserted).

On the other hand, when the output voltage V21 is at the low level, the second voltage detection circuit 2 sets the logic signal V22 to a low level through the inverter circuits 55 and 56, detecting the normal voltage state of the second input voltage Vs2. The transistor 57 turns off in response to the low-level logic signal V22, and thus a pull-up resistor (not shown) outputs the high-level second signal V2 (the second signal V2 is negated).

For example, part or all of the constant current source 25, the reference voltage source 26, the comparator 27, transistors 24 and 57, and the inverter circuits 55 and 56 are each formed by using the second transistor T2.

Figure 8:
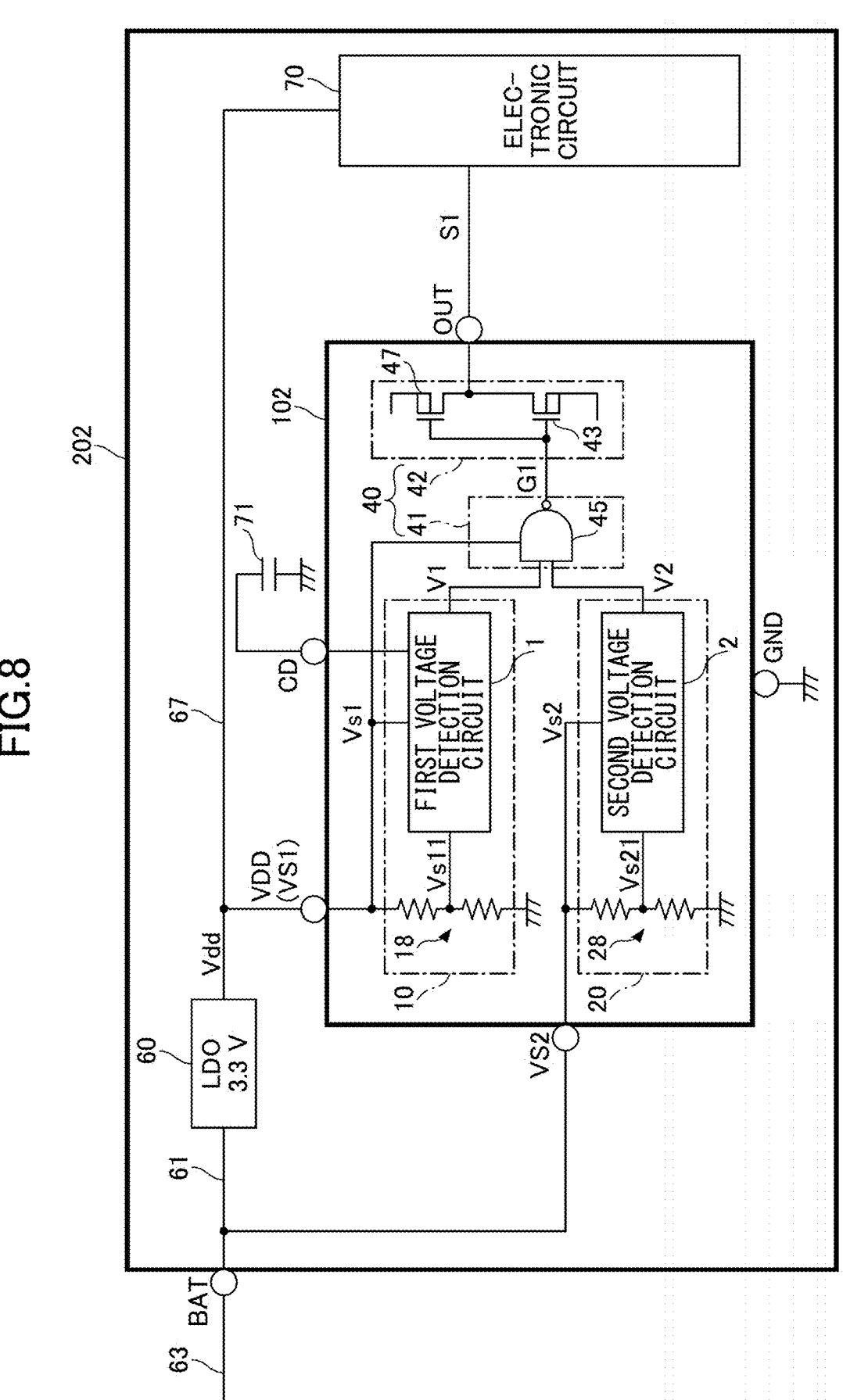
FIG. 8 is a diagram showing a configuration example of the electronic device including the semiconductor integrated circuit according to a second embodiment.

FIG. 8 is a diagram showing a configuration example of the electronic device including the semiconductor integrated circuit according to a second embodiment. In the second embodiment, description of the same configuration, operation, or effect as in the first embodiment will be omitted by referring to the above description. An electronic device 202 shown in FIG. 8 includes a reset IC 102. The reset IC 102 is an example of the semiconductor integrated circuit according to the second embodiment. The reset IC 102 in the second embodiment differs from the reset IC 101 in the first embodiment in that the output stage 42 of the reset IC 102 has a complementary metal oxide semiconductor (CMOS) output configuration. The output stage 42 operates by the power supply voltage Vdd that is applied between the first input terminal VS1 (power supply terminal VDD) and the ground terminal GND.

The output stage 42 includes transistors 43 and 47 that output a reset signal S1 using the CMOS output format. The output stage 42 includes an inverter circuit that uses complementary transistors 43 and 47. By adopting the CMOS output format for the output stage 42, the resistor 65 (see FIG. 1) can be eliminated, and current consumption through the resistor 65 via the transistor 43 when the transistor 43 is in the on-state can be reduced.

Although the embodiments have been described above, the above embodiments are presented by way of examples, and the present disclosure is not limited to the above embodiments. The above embodiments may be embodied in various other forms, and various combinations, omissions, substitutions, modifications, or the like may be made without departing from the gist of the disclosure. These embodiments, their variations, and equivalents are intended to cover the scope and gist of the disclosure.

For example, the semiconductor integrated circuit to which the content of the present disclosure may be applied is not limited to the reset IC, and any other semiconductor integrated circuit such as a power supply IC may be adopted.

The battery power line may include an ignition power line for transmitting an ignition signal or an accessory power line for transmitting an accessory signal.

The electronic device is not limited to a vehicular device, and any other electronic device used in applications beyond the vehicular application may be adopted.

An active state of the reset signal S1 is not limited to active-low, and an active-high state may be adopted. The output configuration of the output circuit 40 may be changes as appropriate.

In the present disclosure, an operating voltage limit that allows for outputting of a reset signal can be reduced.

What is claimed is:

1. A semiconductor integrated circuit comprising:
a plurality of terminals including a first input terminal, a second input terminal, and an output terminal;
a first detection circuit configured to
operate by a first input voltage, as a first power supply voltage, at the first input terminal,
detect a drop in the first input voltage to assert a first signal;
a second detection circuit configured to
operate by a second input voltage, as a second power supply voltage, at the second input terminal,
detect a drop in the second input voltage to assert a second signal; and
an output circuit configured to
monitor the first signal and the second signal, and
output a reset signal from the output terminal, upon occurrence of a condition in which the first signal or the second signal is asserted, wherein the first detection circuit is configured to assert the first signal until the first input voltage decreases from a first detection voltage to a first operating voltage limit, and cause the first signal to enter an indeterminate state, upon occurrence of a condition in which the first input voltage decreases to be less than the first operating voltage limit, wherein the second detection circuit is configured to assert the second signal until the second input voltage decreases from a second detection voltage to a second operating voltage limit, and cause the second signal to enter an indeterminate state, upon occurrence of a condition in which the second input voltage decreases to be less than the second operating voltage limit, and wherein the first operating voltage limit is less than the second operating voltage limit.

2. The semiconductor integrated circuit according to claim 1, wherein the first detection circuit includes a first transistor having a first threshold voltage, and the first transistor is configured to turn off upon occurrence of a condition in which the first input voltage decreases to be less than the first operating voltage limit, in conjunction with a condition in which a gate voltage of the first transistor becomes less than the first threshold voltage, wherein the second detection circuit includes a second transistor having a second threshold voltage, and the second transistor is configured to turn off upon occurrence of a condition in which the second input voltage decreases to be less than the second operating voltage limit, in conjunction with a condition in which a gate voltage of the second transistor becomes less than the second threshold voltage, and wherein the first threshold voltage is less than the second threshold voltage.

3. The semiconductor integrated circuit according to claim 2, wherein the first transistor has a withstand voltage less than that of the second transistor.

4. The semiconductor integrated circuit according to claim 1, wherein the output circuit includes a logic circuit configured to receive the first signal and the second signal, and an output stage configured to output the reset signal in accordance with an output signal of the logic circuit.

5. An electronic device comprising:

the semiconductor integrated circuit of claim 1;

a first power line coupled to the first input terminal;

a second power line coupled to the second input terminal; and an electronic circuit coupled to the first power line and the output terminal.

6. The electronic device according to claim 5, further comprising:

a regulator configured to decrease a voltage of the second power line to output the decreased voltage to the first power line.

7. The electronic device according to claim 6 wherein the second power line is configured to be coupled to a battery power line for a vehicle.

\* \* \* \* \*